(12) United States Patent
Krishnan

(10) Patent No.: US 7,768,095 B2
(45) Date of Patent: Aug. 3, 2010

(54) SHALLOW TRENCH ISOLATION PROCESS UTILIZING DIFFERENTIAL LINERS

(75) Inventor: Srinath Krishnan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/538,008

(22) Filed: Aug. 7, 2009

(65) Prior Publication Data

US 2009/0294896 A1 Dec. 3, 2009

Related U.S. Application Data

(62) Division of application No. 12/047,636, filed on Mar. 13, 2008, now Pat. No. 7,626,242, which is a division of application No. 10/769,835, filed on Feb. 2, 2004, now Pat. No. 7,364,962.

(51) Int. Cl.
*H01L 29/93* (2006.01)

(52) U.S. Cl. .................................... 257/510; 257/506
(58) Field of Classification Search ................. 257/510, 257/506
See application file for complete search history.

(56) References Cited

U.S. PATENT DOCUMENTS

| | | | |
|---|---|---|---|
| 6,486,517 B2 * | 11/2002 | Park | 257/374 |
| 6,737,706 B2 * | 5/2004 | Lee et al. | 257/347 |
| 6,770,530 B2 * | 8/2004 | Efferenn et al. | 438/248 |
| 2004/0115897 A1 * | 6/2004 | Inoue et al. | 438/424 |

* cited by examiner

*Primary Examiner*—Douglas M Menz
(74) *Attorney, Agent, or Firm*—Meyertons, Hood, Kivlin, Kowert & Goetzel, P.C.

(57) ABSTRACT

A method of manufacturing an integrated circuit (IC) can utilize a shallow trench isolation (STI) technique. The shallow trench isolation technique can be used in an IC process. Separate liners for the trench are used for NMOS and PMOS regions. The liners can induce strain in the substrate.

20 Claims, 7 Drawing Sheets

SHALLOW TRENCH ISOLATION PROCESS UTILIZING DIFFERENTIAL LINERS

CROSS-REFERENCE TO RELATED PATENT APPLICATIONS

This application is a divisional application of U.S. application Ser. No. 12/047,636, filed Mar. 13, 2008, entitled "Shallow Trench Isolation Process Utilizing Differential Liners" invented by Krishnan, which itself is a divisional application of U.S. application Ser. No. 10/769,835, filed Feb. 2, 2004, entitled, "Shallow Trench Isolation Process Utilizing Differential Liners" invented by Krishnan, each of which are incorporated herein by reference in its entirety and assigned to the Assignee of the present application.

FIELD OF THE INVENTION

The present invention is related to integrated circuit (IC) devices and to processes of making IC devices. More particularly, the present invention relates to a method of forming trench isolation liners for use in strained silicon metal oxide semiconductor (SMOS) or other ICs.

BACKGROUND OF THE INVENTION

Integrated circuits (ICs) include a multitude of transistors formed on a semiconductor substrate. Various methods of forming transistors on a semiconductor substrate are known in the art. Generally, transistors are isolated from each other by insulating or isolation structures.

One process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner is typically an oxide material (e.g., $SiO_2$) formed at a very high temperature in a hydrochloric (HCl) acid ambient. An insulative material, such as, silicon dioxide ($SiO_2$), is blanket deposited over the nitride layer and the liner within the trench. The insulative material is polished to create a planar surface. The nitride layer is subsequently removed to leave the oxide structures within the trenches.

Shallow trench isolation (STI) structures are utilized in strained silicon (SMOS) processes to separate NMOS (N-channel) and PMOS (P-channel) transistors. SMOS processes are utilized to form strained layers that increase transistor (MOSFET) performance by increasing the carrier mobility of silicon. Increasing carrier mobility reduces resistance and power consumption and increases drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

Complementary metal oxide semiconductor (CMOS) IC's utilize NMOS and PMOS transistors. NMOS transistors are generally provided in P-type wells or on a P-type substrate. P-channel transistors are generally provided in N-type wells disposed in a P-type substrate. Generally, STI structures separate transistors in N-type wells from transistors in P-type wells.

The STI liner (typically an oxide liner) can create stress in the channel associated with N-type and P-type transistor. However, if the same liner (the same material and/or the same thickness) is utilized for both N-type or P-type transistors, the stress created by the STI liner is different for the N-type transistors than it is for the P-type transistors. For example, an oxide liner may be more beneficial for stress in one type of N or P-doped region than in another type of N or P-region of a CMOS IC. Differentiated stress between N and P-type regions affects the operational characteristics of the N and P-type transistors.

Thus, there is a need for an STI liner fabrication scheme which creates similar stress in P-type and N-type regions. Further still, there is a need for a process of forming high quality oxides for N and PMOS regions with superior stress. Further still, there is a need for a differentiated SMOS trench liner formation process for CMOS processes. Further still, there is a need for an STI process that utilizes different materials or thickness of liners according to NMOS and PMOS transistor locations. Yet further, there is a need for an IC with differentiated liners for isolation structures. Yet further still, there is a need for a differentiated STI liner process that equalizes stress in N and P-type channels.

SUMMARY OF THE INVENTION

The present invention relates to a method of manufacturing an integrated circuit having trench isolation regions in a substrate. The method includes forming a mask layer above the substrate, selectively etching the mask layer to form apertures associated with the locations of the trench isolation regions, and forming trenches in the substrate at the locations. The method also includes forming first type liners on first side walls of the trenches associated with the first type regions of the substrate, and forming second type liners on second side walls of the trenches associated with second type regions.

Another exemplary embodiment relates to a method of forming trench isolation liners in a CMOS IC. The method includes forming a trench in a layer above a substrate or in the substrate, forming a first liner for a first side wall in the trench, and forming a second liner for a second side wall of the trench. The trench separates a first doped region from a second doped region. The first side wall is associated with the first doped region and the second side wall is associated with the second doped region.

Still another exemplary embodiment relates to an integrated circuit. The integrated circuit includes a first doped region of a substrate and a second doped region of a substrate, a first liner, and a second liner. The first liner is disposed on a first side wall of a trench between the first doped region and the second doped region. The second liner is disposed on a second side wall of the trench.

BRIEF DESCRIPTION OF THE DRAWINGS

Exemplary embodiments will become more fully understood from the following detailed description, taken in conjunction with the accompanying drawings, wherein like reference numerals refer to like parts, and wherein:

FIG. 10 is a cross-sectional view of the portion illustrated in FIG. 9, showing a trench etching step;

FIG. 11 is a cross-sectional view of the portion illustrated in FIG. 9, showing a first liner oxidation step;

FIG. 12 is a cross-sectional view of the portion illustrated in FIG. 9, showing a second liner oxidation step; and FIG. 13 is a cross-sectional view of the portion illustrated in FIG. 3, showing a trench filling step.

DETAILED DESCRIPTION OF THE PREFERRED EMBODIMENTS

FIGS. 1 through 8 illustrate a method of manufacturing an integrated circuit (IC) in accordance with an exemplary embodiment on a bulk substrate. FIGS. 1, 2, 4 and 9-13 illustrate a method of manufacturing an IC in accordance with another exemplary embodiment on a semiconductor-on insulation (SOI) substrate. The methods illustrated in FIGS. 1 through 13 reduce the stress differentials associated with liners disposed on trenches separating differently doped regions. The methods can be used in a shallow trench isolation (STI) process or any process requiring a liner oxide where stress or strains are of concern, such as, in an SMOS process. Advantageously, the liner oxides can be formed in two different process steps and yet provide a high quality oxide with good compatibility.

Figure 2:
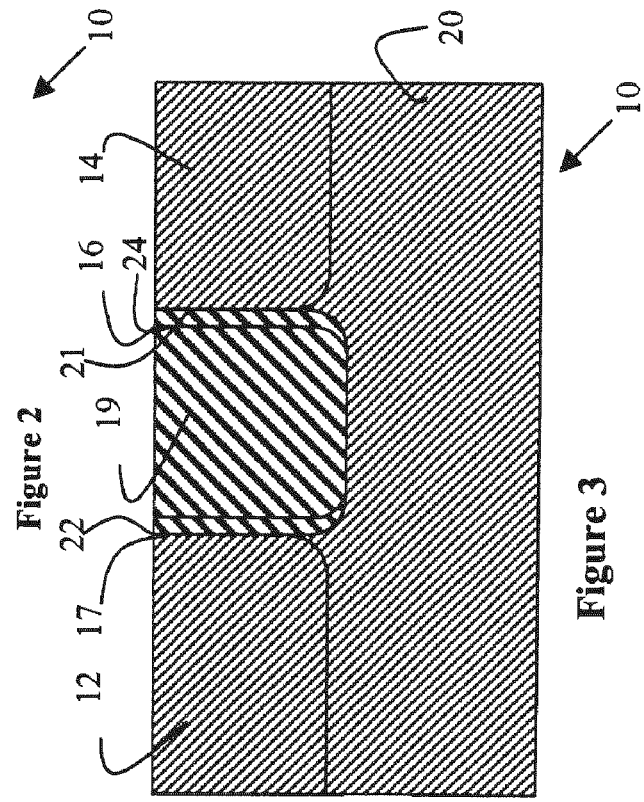
FIG. 2 is a cross-sectional view of the portion illustrated in FIG. 1, taken about line 2-2 showing the trench structure.
Figure 1:
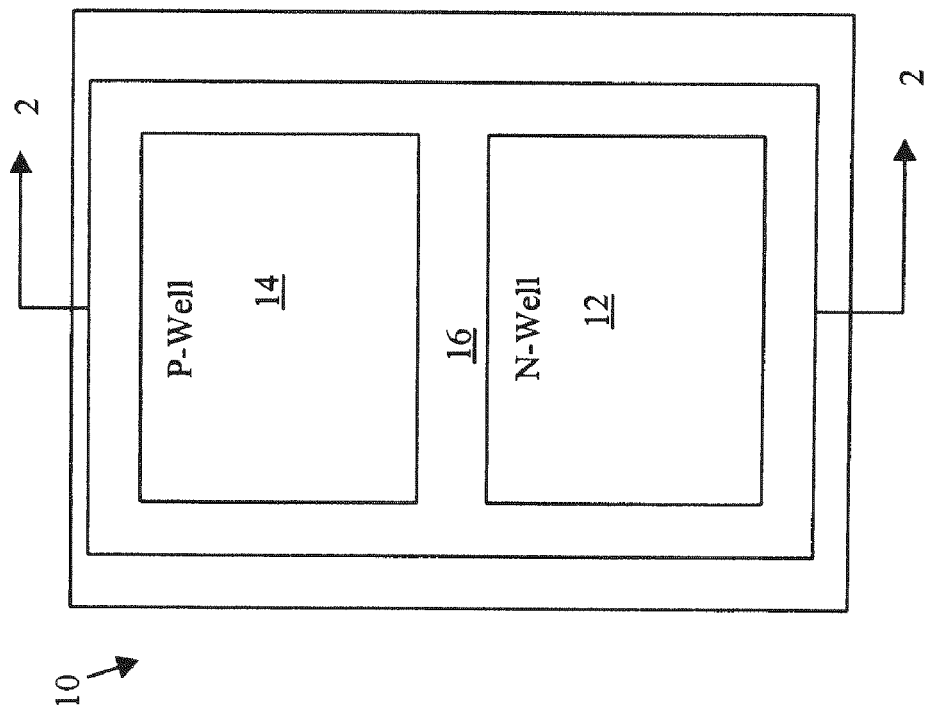
FIG. 1 is a top view of a portion of an integrated circuit including a trench structure in accordance with an exemplary embodiment.
Figure 4:
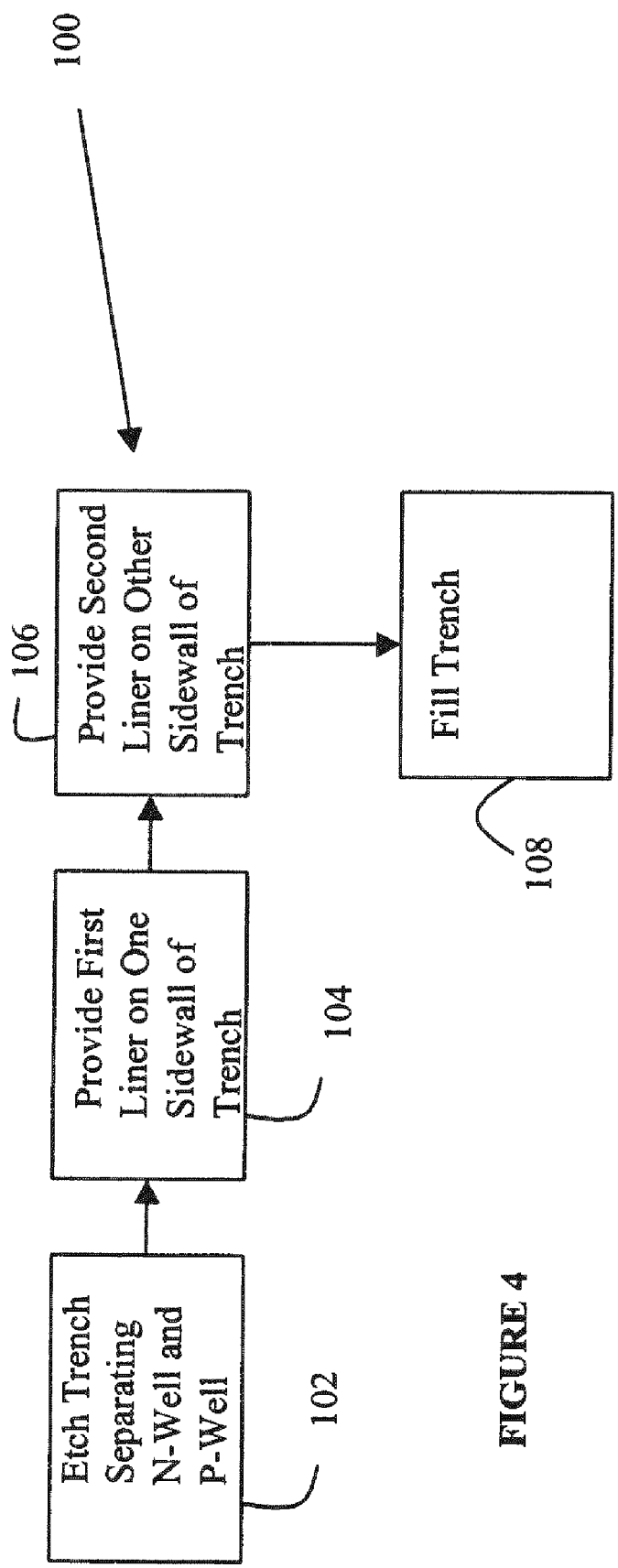
FIG. 4 is a general flow diagram of a process for forming the portion of the integrated circuit illustrated in FIG. 3 in accordance with yet another exemplary embodiment.

Referring to FIGS. 1 and 2, a portion 10 of an integrated circuit (IC) is illustrated. Portion 10 is subjected to process 100 (FIG. 4) to form a trench isolation region, such as a shallow trench isolation (STI) structure 16. Portion 10 includes a substrate such as bulk substrate 20. Substrate 20 can include or be a germanium-containing layer or substrate.

Substrate 20 can be provided as an SOI substrate (a structure with a substrate below a buried oxide layer that is below a strained layer). The embodiment described with reference to FIGS. 9-13 shows a substrate 220 in accordance with an SOI structure. Substrate 20 can be any of a variety of IC materials. In one embodiment, substrate 20 is a semiconductor substrate such as a strained silicon substrate.

Portion 10 can be any type of semiconductor device, or portion thereof, made from any of the various semiconductor processes, such as a complementary metal oxide semiconductor (CMOS) process, a bipolar process, or another semiconductor process. Portion 10 may be an entire IC or a portion of an IC, and may include a multitude of electronic component portions.

Portion 10 preferably includes CMOS transistors provided in at least one N-well or region 12 and at least one P-well or region 14. N-well or region 12 is preferably comprised of silicon or strained silicon doped with N-type dopants. P-well or region 14 is preferably silicon or strained silicon doped with P-type dopants. N-type and P-type dopants are well known in the art.

Substrate 20 can be a P-type substrate such that P-well or region 14 is part of substrate 20 and is not a separate region in substrate 20 as shown in FIGS. 1 and 2. Alternatively, substrate 20 can be an N-type substrate within which P-well or region 14 is provided. In such an embodiment, N-well or region 12 can be part of substrate 20 or can be provided within another P-well.

N-well or region 12 and P-well or region 14 are separated by trench structure 16. As shown in FIG. 1, trench structure 16 covers all four sides of N-well or region 14 and P-well or region 12, however, other configurations for structure 16 can be utilized. Preferably, trench structure 16 extends beyond a bottom most part of N-well or region 12 and P-well or region 14. Transistors having N-channel regions can be disposed in region 14 and transistors having P-channel regions can be disposed in region 12 in accordance with CMOS techniques. Regions 12 and 14 can contain various transistor structures such as source and drain regions, extensions, channel regions, etc.

Figure 3:
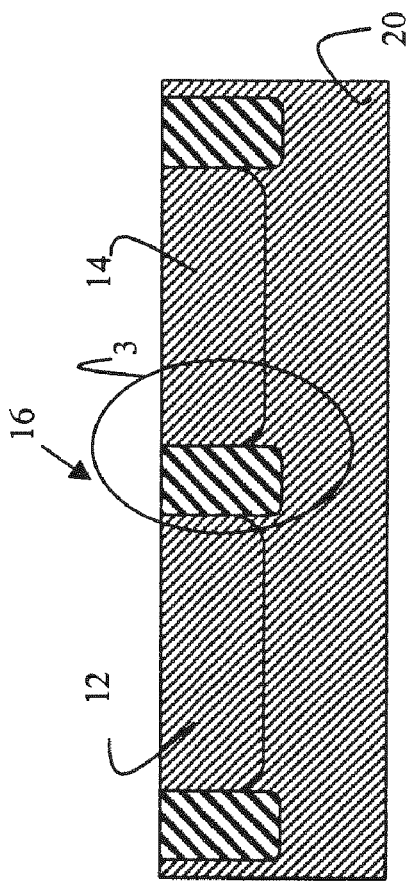
FIG. 3 is an enlarged cross-sectional view associated with encircled section 3 illustrated in FIG. 2, in accordance with another exemplary embodiment.

With reference to FIG. 3, trench structure 16 (encircled by curve 3 in FIG. 2) includes trench fill material 19 disposed between a first liner 22 and a second liner 24. Liner 22 is preferably optimized for stress associated with N-well or region 12 and liner 24 is preferably optimized for stress associated with P-well or region 14. Liner 22 is provided on a side wall 17 of trench structure 16 associated with region 12 and liner 24 is provided on a side wall 19 of trench structure 16 associated with region 14.

In one embodiment, trench structure 16 has a width from side wall 17 to side wall 16 of 1000-5000 angstroms and a depth of 300-3000 angstroms. Trench structure 16 can be a shallow trench isolation (STI) structure. Trench structure 16 including liners 22 and 24 can have a depth greater than regions 12 and 14.

Liner 22 is optimized such that the stress in P-well 12 associated with or caused by liner 22 is similar to the stress in P-well 14 associated with or caused by liner 24. In a first embodiment, the material of liner 22 is different than the material of liner 24 such that the stress in regions 12 and 14 is similar. In a second embodiment, the thickness of liner 22 is different than the thickness of liner 24 such that the stress in regions 12 and 14 is similar. In a third embodiment, the material and thickness of liner 22 and the material and thickness of liner 24 is different so that the stress in regions 12 and 14 is similar.

In one embodiment, liner 24 associated with P-well region 14 is a dry oxide material (pure oxide) and liner 22 associated with region 12 is a dry heavily nitrided oxide. Alternatively, liner 22 can be manufactured from a different material that causes tensile stress in region 12. In one embodiment, liners 22 and 24 are different materials chosen from silicon oxides, nitrides, and oxynitrides. Liners 22 and 24 can have thicknesses of 50-400 Å and sufficiently densified to create stress. Generally, it is desirous to have P-well or region 14 with compressive stress associated with liner 24 and N-well or region 12 having tensile stress.

With reference to FIGS. 1-4, a process 100 can be utilized to form trench structure 16 (FIGS. 1-3). In a step 102, an aperture or trench for trench structure 16 is etched in substrate 20. The trench can be used to define wells or regions 12 and wells or regions 14 as well as active regions within regions 12 and 14. Regions 12 and 14 can be formed before or after the aperture for trench structure 16 as formed. Preferably, a hard mask etching step is utilized to form the aperture for trench structure 16. The etching step can be a dry etching step selective to the material of substrate 20.

In a step 104 of process 100, a liner such as liner 22 is provided on a sidewall 17 associated with well or region 12. The liner is covered with a hard mask after forming. The mask does not cover side wall 21. In a step 106, liner 24 is provided on side wall 21. Liner 24 is manufactured from a different material than liner or has a different thickness or both a different material and thickness than liner 22. In a step 108, trench fill material 19 is provided between liners 22 and 24 to complete trench 16. Trench fill material 19 can be blanket deposited over substrate 20 and etched or planarized to leave material 19 within the aperture associated with trench 16. Trench fill material 19 is a TEOS material.

Figure 5:
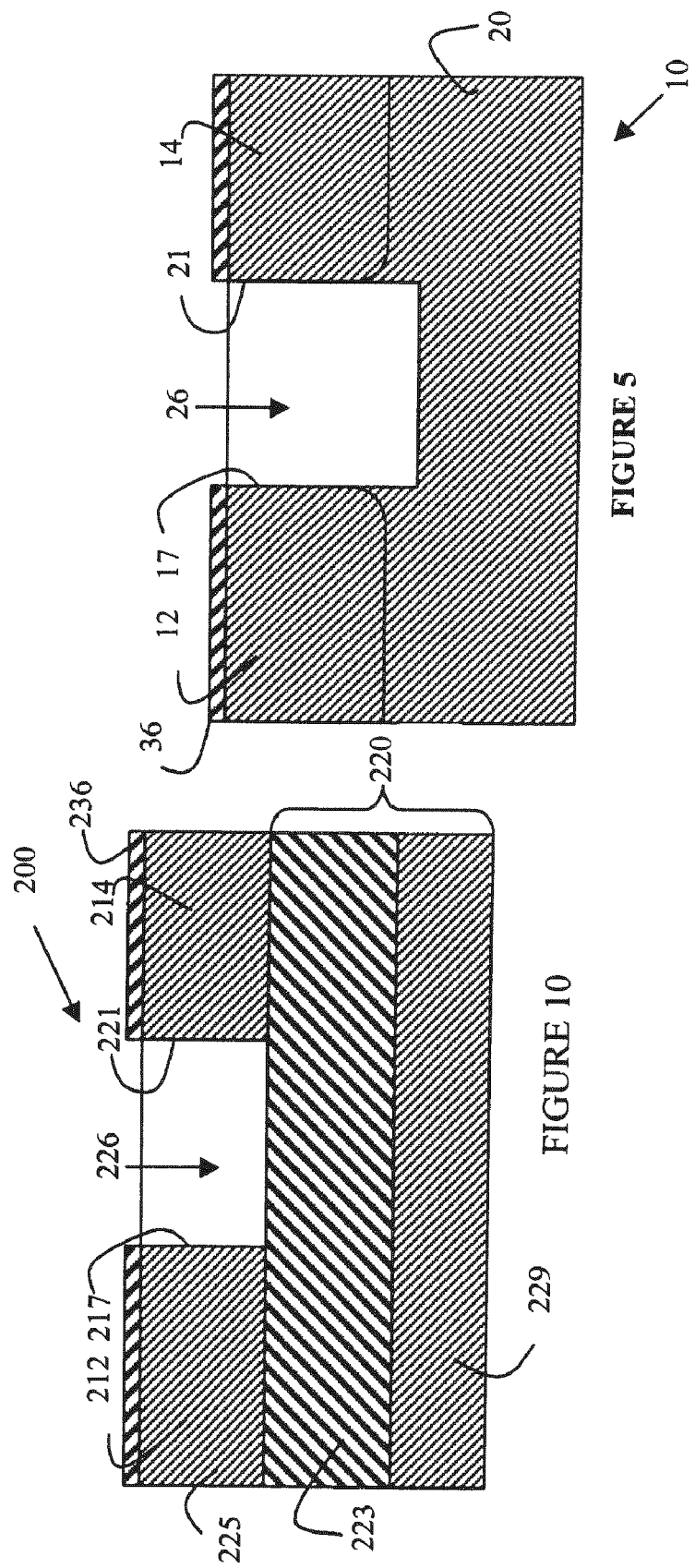
FIG. 5 is a cross-sectional view of the portion illustrated in FIG. 3, showing a trench etching step.

With reference to FIGS. 4-8, process 100 is described in more detail below as follows. In FIG. 5, an aperture 26 for trench 16 is etched (step 102), leaving side wall 17 associated with region 12 and sidewall 21 associated with region 14. Aperture 26 is preferably etched to a depth below a bottom of region 12 or 14. Substrate 20 is selectively etched using a hard mask such as a silicon nitride layer 36 selectively patterned using photolithography according to step 102.

Figure 6:
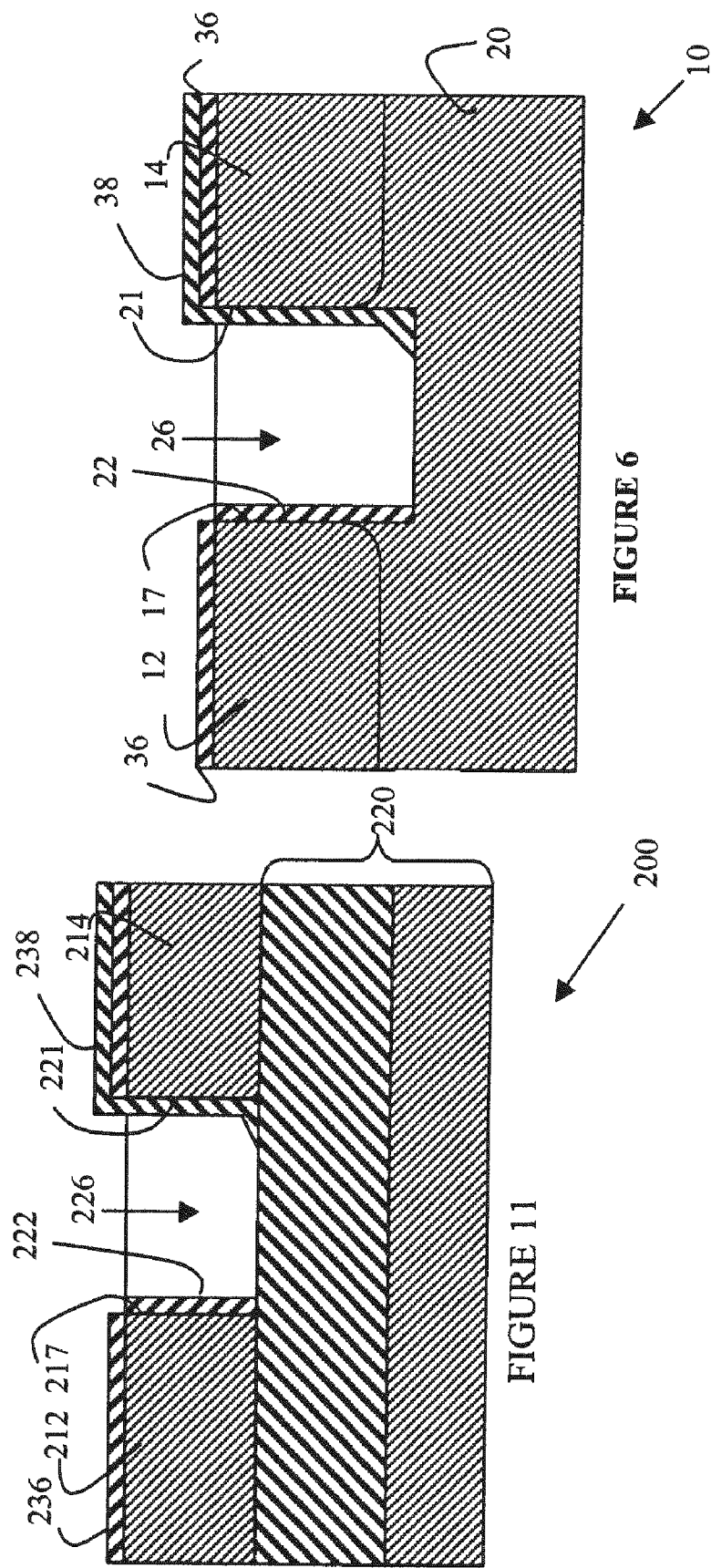
FIG. 6 is a cross-sectional view of the portion illustrated in FIG. 5, showing a first liner oxidation step.

In FIG. 6, a mask material, such as, a photoresist layer or hard mask layer is provided on sidewall 21 and above a top surface of layer 36 over region 14. In one embodiment, a layer of silicon nitride or silicon oxynitride is provided over sidewall 21 and layer 36 above region 14. Layer 38 can selectively coat sidewall 21 and not coat sidewall 17 through the use of photolithographic patterning techniques. Alternatively, a mask layer can be provided within aperture 26 and etched in at an angle to leave the mask layer on only sidewall 21.

After layer 38 is provided to protect sidewall 21, layer or liner 22 is formed on sidewall 17 (step 104 of process 100). Liner 22 can be formed in a variety of processes. Preferably, liner 22 is formed by thermally growing a silicon dioxide material. In one embodiment, liner 32 is formed in a thermal process using a pure dry oxide ambient. Liner 22 can have a thickness of 50-400 Å.

In alternative embodiments, liner 22 can be formed in a low temperature process and be between approximately 200 and 500 Å thick. Liner 22 can also be formed on a bottom of aperture 16 associated with trench isolation structure 16. Alternatively, the bottom of aperture 26 can also be covered by layer 38.

In another embodiment, liner 22 is formed in an ultraviolet ozone (UVO) process. In such an embodiment, sidewall 17 is exposed to UV light to form ozone ($O_3$) and atomic oxygen (O) by absorbing UV light having a wavelength of approximately 185 nm. Once formed, the ozone can undergo further decomposition to form additional atomic oxygen by absorbing UV light having a wavelength of about 254 nm.

In another alternative, a PECVD process, such as dual frequency RF power PECVD process, can be utilized to form liner 22 at temperatures between 500 and 550° C. In yet another embodiment, liner 22 can be formed by an atomic layer deposition (ALD) technique having a temperature of approximately 700° C. with a saline and oxygen atmosphere. In yet another embodiment, liner 32 can be formed in a high density oxide deposition (HDP) process, such as an HDP process utilizing RF power.

Figure 7:
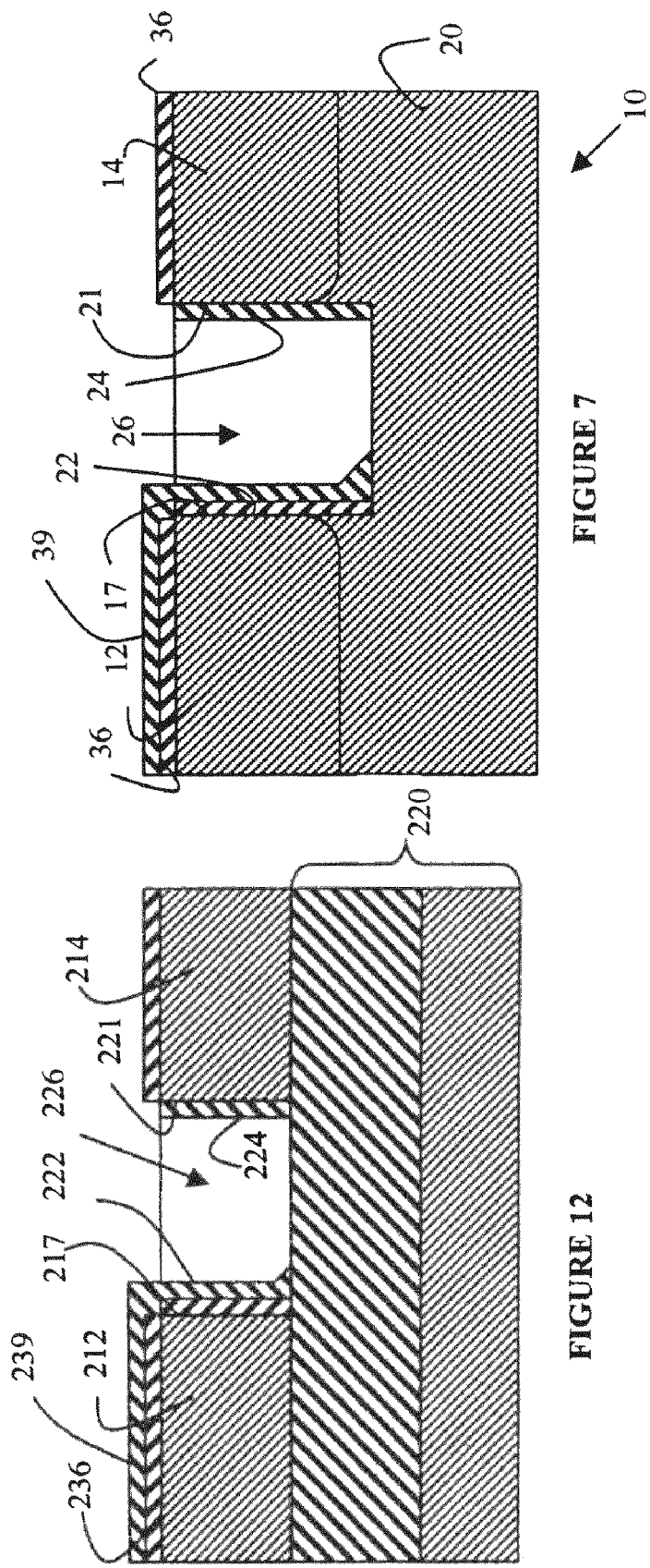
FIG. 7 is a cross-sectional view of the portion shown in FIG. 3, showing a second liner oxidation step.

With reference to FIG. 7, after liner 22 is formed, material 38 is removed from sidewall 21. Layer 38 can be removed in a dry etching process selective to material 38 such as a dry etching process selective to silicon nitride with respect to silicon dioxide and silicon. A mask layer or material 39 is provided above layer 36 associated with region 12 and over liner 22. Layer or material 39 is preferably similar to material 38 and covers liner 22.

After liner 22 is protected by material 39, a liner 24 is grown on sidewall 21 (step 106). Liner 24 is similar to liner 22, however, liner 24 is grown in a process different than a process used to create liner 22 or is grown to a different thickness than liner 24.

In a preferred embodiment, liner 22 is grown by a dry oxide process and liner 24 is grown by a dry nitrided oxide process. Liner 24 can be 50-400 Å thick. After liner 24 is formed, material 39 is removed. In one embodiment, material 36 can also be removed.

Figure 8:
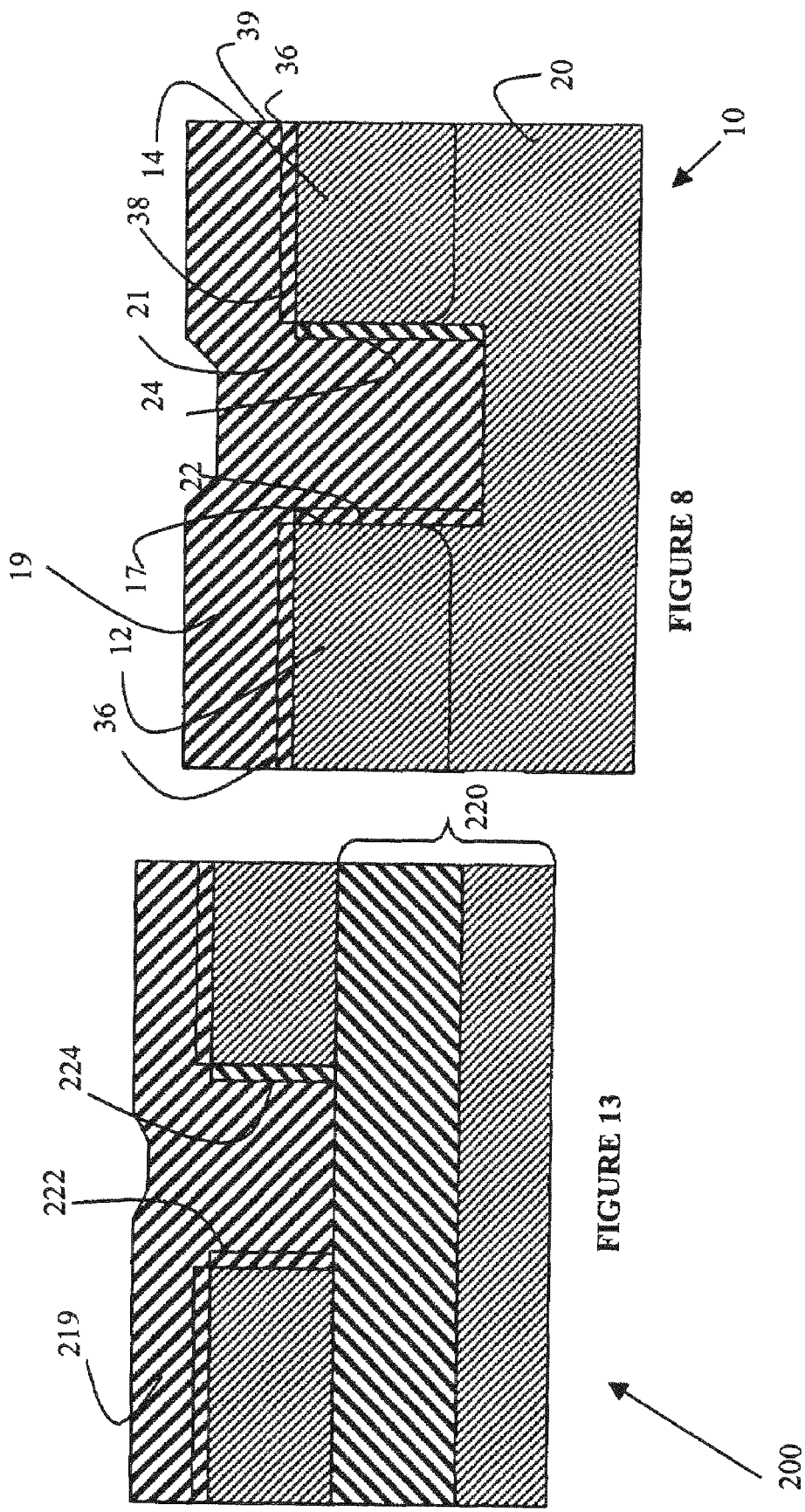
FIG. 8 is a cross-sectional view of the portion illustrated in FIG. 3, showing a trench filling step.

With reference to FIG. 8, trench fill material 19 is provided between liners 22 and 24. Material 19 is preferably silicon dioxide deposited in a high density plasma (HDP) process or in a tetraethylorthosilicate (TEOS) process. Alternatively, a boron phosphate silicon glass (BPSG) process can be used. Material 19 preferably fills aperture 26 with trench structure 16 and can be approximately 2,000-8,000 Å thick. Material 19 is removed by polishing/etching until a top surface of layer 36 or substrate 20 is reached.

Figure 9:
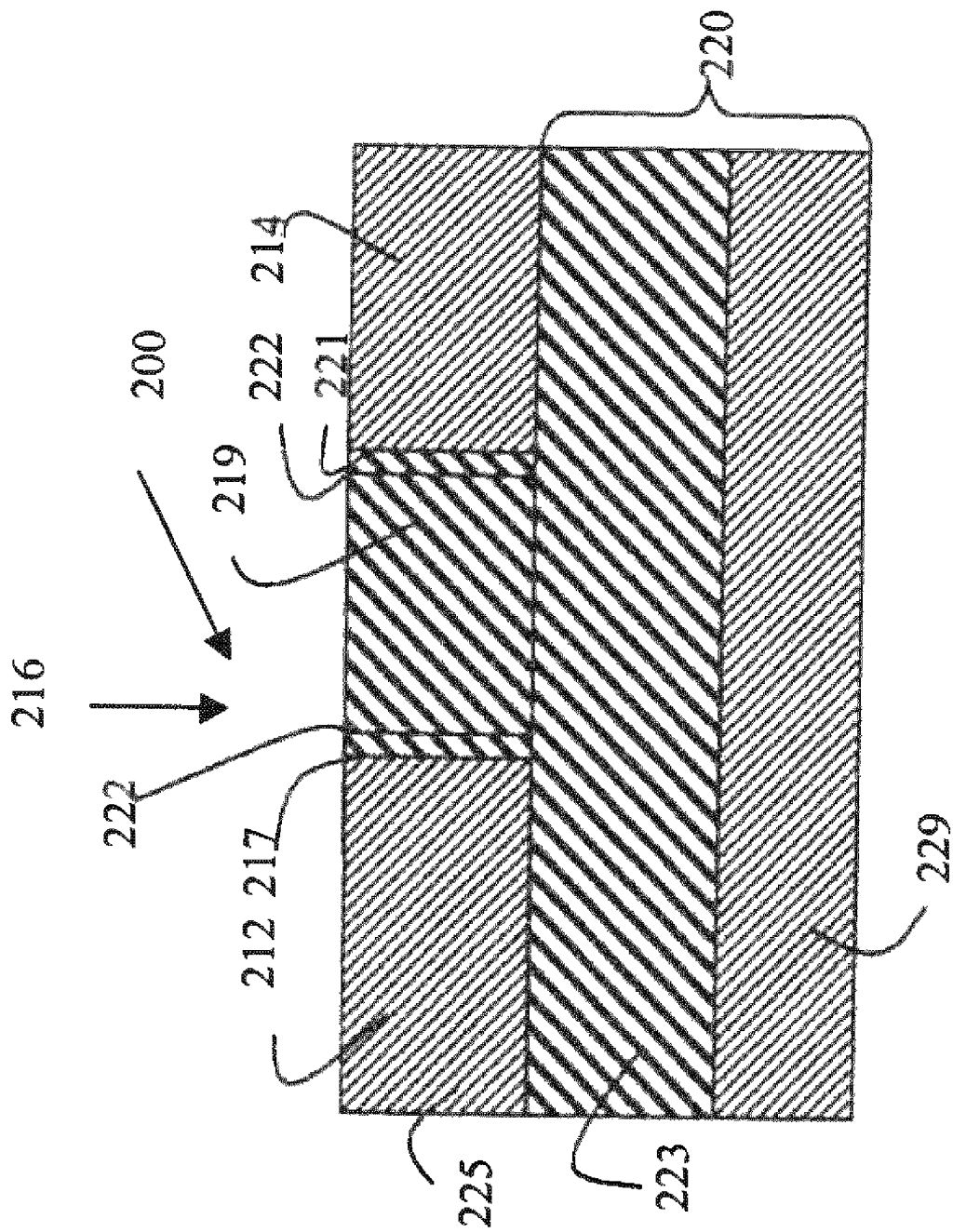
FIG. 9 is a cross-sectional view corresponding to another embodiment similar to the cross-sectional view illustrated in FIG. 3.

With reference to FIGS. 1-4 and 9-13, process 100 is provided on a substrate 220 shown in FIG. 9 as a silicon-on-insulator (SOI) substrate. Substrate 220 includes a base layer 229, such as a single crystal silicon layer, and a silicon dioxide layer or buried oxide layer, such as layer 223. A layer 225 is provided above layer 223. Layer 225 is preferably a strained silicon layer. Layer 223 can provide appropriate seeding for a strained layer such as layer 225.

Layer 225 can be formed above layer 223 in an epitaxial process, such as growth by CVD. Alternatively, layer 225 can be other deposition processes. Layer 16 can have a thickness between 50 and 150 Å. Layer 225 can be similar to substrate 20 and can include germanium. Layer 225 can be formed by utilizing germanium or other methods for providing strained in layer 225.

In FIG. 9, portion 200 includes P-well or region 212 and N-well or region 214 similar to regions 12 and 14, respectively. A shallow trench isolation structure 216 is provided in portion 200. Structures in FIGS. 9-13 similar to structures in FIGS. 5-8 have reference numerals differentiated by 200.

Liners 222 and 224 similar to liners 22 and 24 are provided between sidewalls 217 and 221. Preferably, trench structure 216 extends from a top surface of layer 225 to a bottom surface of layer 225 or top surface of layer 223.

Trench structure 216 preferably has a depth of between approximately 1500 and 4000 Å and a width of 0.18-1.50 nm or below. Trench structure 216 can have a trapezoidal cross-sectional shape with the narrower portion being at the bottom. Trench structure 16 can also have other cross-sectional shapes.

With reference to FIGS. 9-13, process 100 is described in more detail below as follows. In FIG. 10, an aperture 226 for trench 216 is etched (step 102), leaving sidewall 217 associated with region 212 and sidewall 221 associated with region 214. Aperture 226 is preferably etched to a depth below a bottom of region 212 or 214. Substrate 220 is selectively etched using a hard mask such as a silicon nitride layer 236 selectively patterned using photolithography according to step 102.

In FIG. 11, a mask material, such as, a photoresist layer or hard mask layer 238 is provided on sidewall 221 and above a top surface of layer 236 over region 214. In one embodiment, a layer of silicon nitride or silicon oxynitride is provided over sidewall 221 and layer 236 above region 214. Layer 238 can selectively coat sidewall 221 and not coat sidewall 217 through the use of photolithographic patterning techniques. Alternatively, a mask layer can be provided within aperture 226 and etched in at an angle to leave the mask layer on only sidewall 221.

After layer 238 is provided to protect sidewall 221, layer or liner 222 is formed on sidewall 217 (step 104 of process 100). Liner 222 can be formed in a variety of processes. Preferably, liner 222 is formed by thermally growing a silicon dioxide material. In one embodiment, liner 22 is formed in a thermal process in a pure dry oxide ambient. Liner 222 can have a thickness of 50-400 Å. In alternative embodiments, liner 222 can be formed in process similar to any of the processes used to form liner 22 (FIG. 6).

With reference to FIG. 12, after liner 222 is formed, material 238 is removed from sidewall 221. Layer 238 can be removed in a dry etching process selective to material 238 such as a dry etching process selective to silicon nitride with respect to silicon dioxide and silicon. A mask layer 239 is provided above layer 236 associated with region 212 and liner 222. Material layer 239 is preferably similar to material 238 and covers liner 222.

After liner 222 is protected by layer 239, a liner 224 is grown on sidewall 221 (step 106). Liner 224 is similar to liner 222, however, liner 224 is grown in a process different than a process used to create liner 222 or has a different thickness than liner 222. In a preferred embodiment, liner 222 is grown by a dry oxide process and liner 224 is grown by a dry nitride/oxide process. After liner 224 is formed, material 239 is removed. Liner 224 can be 50-400 Å thick. In one embodiment, material 236 can also be removed.

With reference to FIG. 13, trench fill material 219 is provided between liners 222 and 224. Material 219 is preferably silicon dioxide deposited in a high density plasma (HDP) process or tetraethylorthosilicate (TEOS) process. Alternatively, a boron phosphate silicon glass (BPSG) process can be used. Material 219 preferably fills aperture 226 with trench structure 216 and can be approximately 2,000-8,000 Å thick. Material 219 is removed by polishing/etching until a top surface of layer 236 or substrate 220 is reached.

It is understood that while the detailed drawings, specific examples, and particular values given provide a preferred exemplary embodiment of the present invention, it is for the purpose of illustration only. The shapes and sizes of trenches and liners are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. An integrated circuit, comprising:
   a base layer of a substrate;
   a buried insulative layer of a substrate disposed on the base layer;
   a first doped region formed on a first portion of the buried insulative layer;
   a second doped region formed on a second portion of the buried insulative layer;
   a trench in the substrate between the second doped region and the first doped region, the trench having a first side wall associated with the first doped region and a second side wall associated with the second doped region, wherein the first side wall has a first exposed substrate and the second side wall has a second exposed substrate;
   a first type liner on a first side wall of a trench;
   a second type liner on a second side wall of the trench, wherein the first type liner is not disposed on the second side wall and the second type liner is not disposed on the first side wall.

2. The integrated circuit of claim 1, wherein the trench reaches the buried insulative layer of the substrate.

3. The integrated circuit of claim 1, wherein the first doped region and the second doped region are formed in a strained layer.

4. The integrated circuit of claim 1, wherein the first type liner is a first thickness and the second type liner is a second thickness, the second thickness being different than the first thickness.

5. The integrated circuit of claim 1, wherein the first type liner is grown in a process different than the process used to create the second type liner.

6. The integrated circuit of claim 1, wherein the first doped region is an n-type region and the second doped region is a p-type region.

7. The integrated circuit of claim 1, wherein the first type liner and the second type liner are different materials.

8. The integrated circuit of claim 7, wherein the first type liner is a dry oxide material and the second type liner is a dry heavily nitrided oxide material.

9. The integrated circuit of claim 8, wherein the second type liner is less than 400 angstroms thick.

10. The integrated circuit of claim 1, further comprising:
    an insulative material deposited in the trench to form a trench isolation region.

11. The integrated circuit of claim 10, wherein the trench is less than 4000 angstroms deep and less than 1.5 nanometers wide.

12. The integrated circuit of claim 10 wherein the insulative material is between the first type liner and the second type liner.

13. The integrated circuit of claim 1, wherein the trench is 300-3000 A deep.

14. The integrated circuit of claim 1, wherein the trench is formed in the strained layer.

15. The integrated circuit of claim 1, wherein the substrate is a semiconductor-on-insulation substrate.

16. The integrated circuit of claim 1, wherein the substrate is silicon germanium.

17. The integrated circuit of claim 1, wherein the first type liner is an oxide grown on the first side wall.

18. The integrated circuit of claim 1 wherein the stress associated with the trench isolation region is similar for the first doped region and the second doped region.

19. The integrated circuit of claim 1 wherein at least one liner is formed in a low temperature process.

20. The integrated circuit of claim 1 wherein at least one liner is formed in an ultraviolet zone process.

* * * * *